United States Patent [19]
Swanson

[11] Patent Number: 6,157,205
[45] Date of Patent: Dec. 5, 2000

[54] GROUNDING SCHEME FOR A HIGH-SPEED DATA CHANNEL

[75] Inventor: Eric J. Swanson, Buda, Tex.

[73] Assignee: Cirrus Logic, Inc., Austin, Tex.

[21] Appl. No.: 09/197,856

[22] Filed: Nov. 23, 1998

[51] Int. Cl.[7] .......................... H03K 17/16; H03K 19/003
[52] U.S. Cl. ................................. 326/30; 326/82
[58] Field of Search ................... 326/26, 30, 82, 326/86, 90; 375/296, 259, 285

[56] References Cited

U.S. PATENT DOCUMENTS

| | | | |
|---|---|---|---|
| 4,788,458 | 11/1988 | Kinoshita et al. | 326/90 |
| 5,159,213 | 10/1992 | Johnson | 326/89 |
| 5,521,415 | 5/1996 | Kondo | 257/357 |
| 5,530,612 | 6/1996 | Maloney | 361/56 |
| 5,629,545 | 5/1997 | Leach | 257/362 |
| 5,654,862 | 8/1997 | Worley et al. | 361/111 |
| 5,708,549 | 1/1998 | Croft | 361/56 |
| 5,821,804 | 10/1998 | Nikutta et al. | 327/382 |
| 6,011,681 | 1/2000 | Ker et al. | 361/111 |

OTHER PUBLICATIONS

Steven Ray, "Rambus Layout Guide," DL–0033–03, Rambus, Mountain View, California, Jan. 1998, pp. 1–A–4.

Steven Ray, "Direct Rambus Technology Disclosure," DL–0040–00, Rambus, Mountain View, California, Oct. 15, 1997, pp. 1–16.

*Primary Examiner*—Michael Tokar
*Assistant Examiner*—Daniel D. Chang
*Attorney, Agent, or Firm*—J. P. Violette; Peter Rutkowski; William W. Kidd

[57] ABSTRACT

A technique for reducing jitter on a data channel utilized for transfer of data between components disposed on the channel. Instead of coupling a ground of the channel directly to a ground network of a chip containing the data transferring device, an impedance between the channel ground and a substrate is utilized to minimize the jitter.

26 Claims, 3 Drawing Sheets

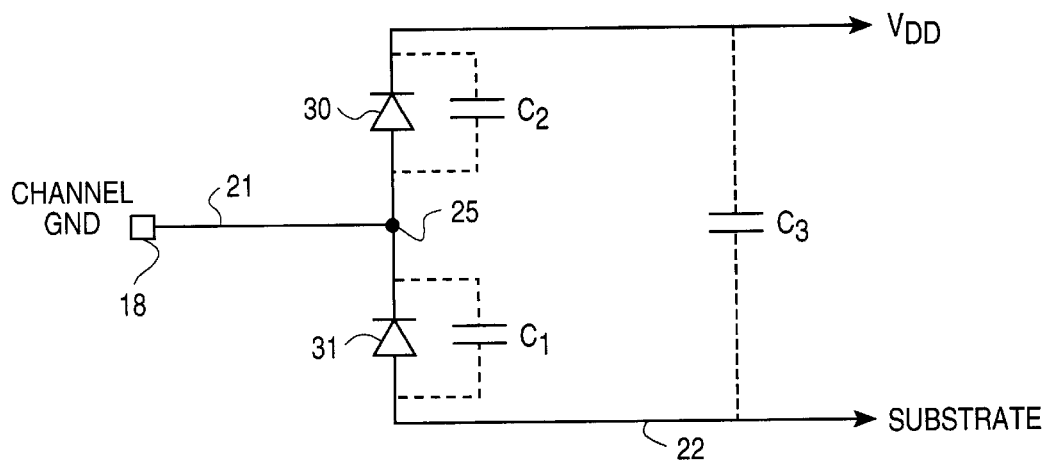
FIG. 2
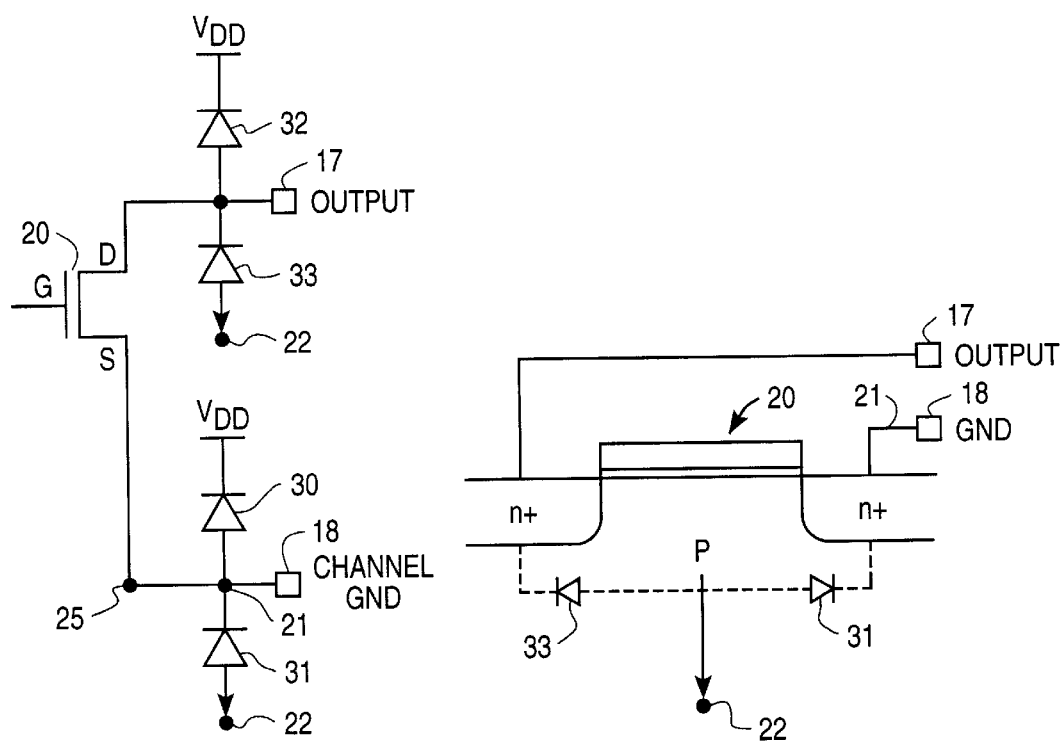
FIG. 3
FIG. 4

GROUNDING SCHEME FOR A HIGH-SPEED DATA CHANNEL

BACKGROUND OF THE INVENTION

1. Field of the Invention

The present invention relates to the field of data transfer on a high-speed data channel and, more particularly, to a grounding technique to remove jitter on the data channel.

2. Background of the Related Art

High-speed data channels are known in the art for use in the transfer of data between components or circuits resident on the channel. Typically, a data channel employs a particular bus architecture with data transfer protocol defined by the architecture. The channel architecture may also have certain physical requirements to ensure that the channel operates within the required design specifications. Further, the design specifications become more stringent as the rate of the data transfer increases (increase in the bandwidth) and meeting the design specification is imperative for proper operation of devices resident on the data channel.

High-speed data channels can be designed for the transfer of data between various circuitry on a single component (such as a semiconductor chip) or between two or more components. In the first instance, the data channel, the data sending circuitry and the data receiving circuitry are fabricated on the same substrate. In the later instance, the data channel is an interface residing outside of the chip. For example, to transfer data between a processor (or controller) and a separate memory not residing on-chip with the processor, a printed circuit (PC) board is utilized. In computer parlance, this PC board is often called the "mother board" when the central processing unit (CPU) is resident thereon or a "video card" when a graphics controller is resident thereon.

One well-known high-speed data channel architecture in use is the Rambusυ data channel (or Rambus channel). The Rambus channel is a high-speed, byte-wide (9 bits), synchronous, chip-to-chip interconnect designed to achieve 600 Mega bytes per second (MB/sec) and greater data transfer rates between components on the channel. One specific Rambus channel, referred to as the Direct Rambus™ channel, is specified to transfer data at 1.6 Giga bytes per second (GB/sec) between components on the channel. In order to operate on the channel, the various components operating on the Rambus channel must interface with the channel and meet the stringent requirements imposed on these components, which are referred to as Rambus components.

In a typical layout, the required power, ground and signal lines are fabricated on a PC board under strict requirements of the Rambus channel layout specifications. The various chips are then placed at designated locations on the board according to the design specifications. The components have the necessary interface circuitry for coupling onto the channel so that the components qualify as a Rambus component. For example, dynamic random-access-memories (DRAMs) meeting the Rambus specification requirements are referred to as Rambus DRAMs or RDRAMs. The RDRAMs are capable of achieving the high-speed data transfer to and from a processor (or controller) also coupled onto the channel.

Although the Rambus channel is capable of achieving high-speed data transfer between the Rambus components on the channel, jitter has been noticed to exist on the signal lines of the data channel. Upon first inspection, the signal jitter appears to be produced or induced when components, particularly processors, are placed on the channel. This is a significant problem for a system manufacturer who may purchase the DRAM, processor and the PC board from different vendors. Each meets the Rambus channel design requirements, but when assembled together, jitter is present on the signal lines of the channel. At the higher transfer rates, the jitter is more pronounced and can contribute to bit transfer errors.

The present invention identifies a source for this jitter and describes a technique for reducing or removing the jitter from the high-speed data transfer channel, such as the Rambus channel.

SUMMARY OF THE INVENTION

The present invention describes a technique for reducing jitter on a data channel utilized for transfer of data between components disposed on the channel. Jitter minimization is achieved by having a ground of the channel coupled to a data transferring device, but without having a channel ground coupled directly to a ground network of a chip containing the data transferring device.

BRIEF DESCRIPTION OF THE DRAWINGS

FIG. 2 is a circuit diagram illustrating the preferred technique in which non-forward biased diodes are utilized to increase the impedance shown in FIG. 1 between the digital core and the interface circuitry to attenuate the coupled interference from the digital core.

FIG. 3 is a circuit diagram illustrating the implementation of the preferred technique shown in FIG. 2 to an open drain transistor circuit which is utilized to drive signals on the data channel.

FIG. 4 is a cross-sectional diagram of the transistor of FIG. 3 in which source and drain diffusions provide n-p junctions to form two of the diodes of FIG. 3.

DETAILED DESCRIPTION OF THE INVENTION

Figure 1:
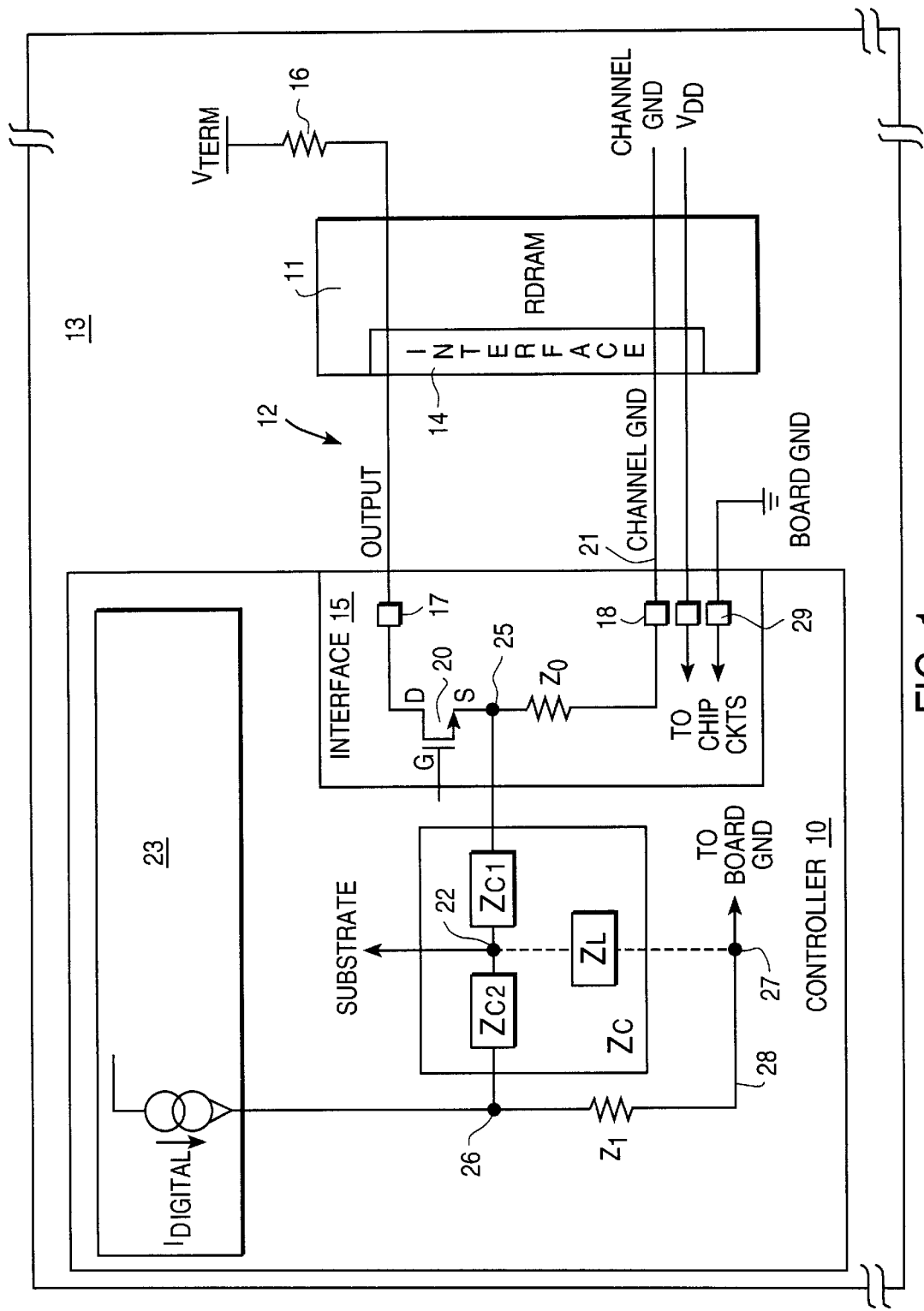
FIG. 1 is a circuit schematic diagram showing a high-speed data channel, components resident on the channel, including a controller for data transfer on the channel, and an equivalent impedance circuit residing between a digital core of the controller and its interface circuitry to the channel, in which the present invention is practiced to increase the shown impedance to reduce jitter on the channel.

Referring to FIG. 1, it shows a controller/processor 10 coupled to a memory 11 by a high-speed data channel 12. In the particular example, channel 12 is comprised of power, ground and signal lines that are fabricated as part of a printed circuit (PC) board 13. The components 10 and 11 are then mounted onto the PC board 13. Although the data channel 12 can be one of a variety of high-speed data channels, the preferred embodiment (and the example shown) implements a high-speed, byte-wide (9-bits), synchronous, chip-to-chip interconnect designed by Rambus Inc. of Mountain View, Calif., which is referred to as the Rambus™ channel. The Rambus channel is capable of achieving high-speed data transfer rates, in the order of 600 MB/sec and greater, including rates as high as 1.6 GB/sec.

The memory 11 is a dynamic random-access-memory (DRAM) utilized for storing data. Since memory 11 is designed to operate on the Rambus channel 12, it includes an interface circuit 14 to allow the data memory to transfer data to or from the channel 12. The memory 11 is referred to as a RDRAM (Rambus DRAM), since it is used on the Rambus channel 12. Typically, a plurality of such memories 11 are placed on the board 13 to operate on the channel 12.

The controller or processor 10 (referred to hereafter as controller 10) can be of a variety of processing units for processing data and transferring or otherwise manipulating the data stored in memory 11. Like the memory 11, the controller 10 is a Rambus channel compliant component, designed to operate on the Rambus channel. The controller 10 has digital processing circuitry, which is represented by a block designated as a digital core 23. The various circuits of the digital core 23 perform the processing task(s), as well as control the data transfer to and from the memory 11.

The controller 10 also includes an interface 15, which circuitry allows the controller 10 to be coupled to the channel 12 and operates pursuant to the specification requirements set out for the Rambus channel for data transfer on the channel 12. Thus, controller 10 is the intelligent component on the channel 12 for controlling the data transfer to and from other components on the channel, namely memory 11. It is appreciated that other buses, data channels, etc. (such as a PCI bus) are typically coupled to the controller 10, separate from channel 12, for transfer of data to and from other components not located on the channel 12. Generally, the data transfer on the high-speed channel 12 is to accelerate the processing function of the controller 10 as the controller interfaces or operates with other components or devices not on the channel 12.

Shown within interface 15 is a driver transistor 20, which is utilized to drive an output signal onto a data line of channel 12. It is appreciated that only one output drive transistor 20 and one data line are shown in FIG. 1, however, the channel 12 is comprised of multiple data lines, each having its own open-drain driver transistor. The Rambus channel specification requires a termination at the other end of the channel for the open-drain driver, which termination is provided by having the data line coupled to $V_{TERM}$ through a termination resistor 16. Because of the Rambus channel requirement, the output driver 20 is a single-ended, open-drain driver (n-channel in the example), in which the drain (D) is coupled to the appropriate data line of channel 12 through a data input/output (I/O) pad 17 of the controller 10. The source (S) is coupled to a channel ground 21 (which is on the PC board) through a ground (GND) terminal (pin or pad) 18 of the controller 10.

It is appreciated that although a single unified ground is desired for the operation of the various components of the channel 12, in reality not all grounds are the same. In practice, especially at higher frequencies of operation, impedances are noted between various ground points or paths. A term, ground network, is used herein to describe the grounds which tie in together on the chip, including the substrate. Ideally, the ground network would be electrically equivalent to the ground of the substrate, but in reality, electrical differences may exist between the various ground points or paths. Thus, some form of impedance (notably, lead inductance and parasitic capacitance) are present between the various grounds, including the ground of the semiconductor substrate, as well as grounds coupled onto the chip from an external source. Also, controllers and processors typically have many power and ground pins, power and ground planes, as well as substantial ties to the substrate of the chip, which all combine to present various impedances in the ground paths. FIG. 1 illustrates the presence of some of these various ground points and paths, and their effect on each other.

As noted in FIG. 1, a number of ground points are noted. The channel ground 21 is the signal ground of the data channel. For the Rambus channel, ground 21 is the Rambus ground. A ground 28 is present to represent a ground that is coupled to an external ground connection. Typically, ground 28 is coupled to a ground of a power supply which supplies power to the digital processing section (digital core 23) of the controller chip 10. In the example, ground 28 is coupled to a ground on the PC board 13 and, accordingly, designated as board ground (Board GND) 28. The board ground 28 is shown coupled to the controller 10 at terminal 29. In practice, it is appreciated that terminal 29 is actually comprised of multiple ground terminals for coupling grounds onto the controller chip 10.

Thus, in FIG. 1, three distinct grounds are noted. One ground is the semiconductor substrate itself (noted at node 22). Another ground is the channel ground 21 coupled to the controller 10 at the terminal 18. The third ground is the board ground 28, which provides the ground for the digital core 23. It is appreciated that the ground at terminal 29 is coupled to various circuits on the chip, including to the digital core 23. It would be desirable for all of the grounds to be common (connected together without any impedance). However, in practice there will be some impedance between these various ground points or paths.

The channel ground 21 is coupled to the source terminal of the driver transistor 20 through the terminal 18. When the driver transistor 20 conducts, due to a high signal state on the gate (G), the output at D is driven low. At high data transfer rates, jitter is noted at the drain output. The jitter is more pronounced as the transfer rate increases. Through observation it has been determined that the source of the jitter is from the switching operation of the digital circuitry in the digital core 23 and this jitter is manifested onto the source S of the transistor 20 and coupled to the drain when the transistor 20 conducts.

Furthermore, observations have shown that a cause of the jitter is due to the manner in which the channel ground 21 is coupled relative to the ground within the controller 10. Prior art specifications for the data channels require that terminal 18 be tightly (directly) coupled to the ground network, and ideally to the substrate 22, for proper connection to the controller 10. This is based on the belief that the substrate is the most desirable ground for any connections to the controller 10. However, grounding the channel ground 21 to the ground network (including the substrate) may not be the most ideal solution, at least when it comes to the occurrence of jitter.

FIG. 1 illustrates an equivalent circuit showing the relationship of the above-described grounds as they relate to the digital circuitry of the controller 10 and the signal line of the channel 12. As shown, the data channel 12 is coupled to the interface 15 which transfers signals between the channel 12 and the various digital circuits of the controller 10. These various digital circuitry form the digital core 23 of the controller chip and their switching effects are represented by a current source, having a digital current $I_{DIGITAL}$. It is appreciated that the digital circuitry can be comprised of a variety of circuits for processing or manipulating the data and such circuits include processing cores, registers, gates, latches, buses, etc. Within the interface 15, the source S of the transistor 20 is coupled to the channel ground 21. This coupling is achieved through an impedance $Z_0$, which denotes the lead inductance when the source S at node 25 is coupled to channel ground 21 through the terminal 18. On the opposite side, impedance $Z_1$ designates the lead inductance between the digital core 23 ground at node 26 and the board ground 28 at node 27, which board ground also couples to terminal pin(s) 29.

Included in the equivalent circuit are three coupling impedances associated with the coupling of nodes 22, 25, 26 and 27. Impedance $Z_{C2}$ is the impedance between the ground side of the digital core 23 (at node 26) and the chip substrate (at node 22). Impedance $Z_{C1}$ is the impedance between the source S (at node 25) and the substrate. Impedance $Z_L$ is the impedance between the substrate and the board ground (at node 27). The three impedances $Z_{C1}$, $Z_{C2}$ and $Z_L$ essentially form a T-network residing between the digital core 23 and the transistor 20. Hence the three impedances are collectively shown as impedance $Z_C$. Impedance $Z_C$ represents the equivalent impedance between nodes 25 and 26 and $Z_C$ is comprised of the T-network of $Z_{C1}$, $Z_{C2}$ and $Z_L$. Thus, $Z_C$ represents the coupling impedance between the digital circuitry on the controller 10 and the output driver in the interface 15. It is through this coupling that the interference is transferred to the source of the transistor 20 to cause the jitter.

It is appreciated that node 22 is a common ground reference representing the substrate of the controller chip 10. Thus, impedance $Z_{C1}$ represents the impedance associated with the source S being coupled to the substrate, while $Z_{C2}$ represents the impedance associated with the digital core 23 being coupled to the substrate. Since the board ground 28 is not the substrate itself, an impedance is noted between the board ground 28 at node 27 and the substrate. This impedance is represented by $Z_L$ in FIG. 1 and its coupling between the nodes 22 and 27 is shown as a dotted-line to illustrate the presence of a parasitic coupling, even without the presence of a direct hardwire connection between these two points.

At the high operating frequencies of the channel, the inductive reactance of the board ground pins is non-negligible, thereby making impedances $Z_1$ and $Z_L$ non-zero. For example, if ten ground terminal pins comprise the connection shown as the terminal 29 and each has an inductance of 3 nH, the parallel equivalent is 0.3 nH. Then, 0.3 nH inductance at 1 GHz yields approximately 1.9 ohms ($2\pi fL=1.884$). Much of this inductance is noted in $Z_1$, but also contributing to $Z_L$. That is, impedance $Z_L$ is present and is not zero.

In the prior art practice, the channel ground 21 on the PC board is treated more like an ordinary power supply ground when the channel 12 is coupled to the controller 10. That is, the prior art requirements direct that the channel ground 21 be coupled to the ground of the device, which is the device substrate. Furthermore, this is to be done with minimal resistance. For example, the Rambus channel specification takes great care in specifying external lead lengths and via hole distance to ensure that additional lead inductance is not introduced on the ground plane to add to $Z_0$. Accordingly, the prior art technique suggests coupling the channel ground 21 to the ground network (including substrate 22). This connection results in a low resistance path in the range of 200–300 milliohms to be placed between the source S node 25 and the substrate, resulting in $Z_{C1}$ taking on this value (of 200–300 milliohms).

Generally, this would not present a jitter problem if $Z_L$ was zero, so that node 27 was also the substrate. However, because $Z_1$ and $Z_L$ are not zero in value, an impedance exists between the board ground 28 and the substrate. As will be noted below, an interfering signal from the digital core 23 is coupled through the substrate (at node 22) to the source S node 25 and this path presents a lower impedance path when the channel ground 21 is directly coupled to the chip substrate.

The impedance $Z_{C2}$ is determined by the source diffusions of the transistors present in the controller 10. That is, many of the n-p junctions to the substrate for the transistors in the digital core 23 comprise the impedance $Z_{C2}$. Since the junctions are in parallel, the resulting total capacitance can be in the order of 1000 pF or more. At 1 GHz, the resulting impedance for $Z_{C2}$ is the capacitive reactance (calculated by $1/(2\pi fC)$), which is very low in value $(1/((2\pi)(1\ Ghz)(1000\ pF))=0.16$ ohms). Accordingly, $Z_{C2}$ is intrinsically low.

Without the channel ground connection, the impedance $Z_{C1}$ is also determined by a source diffusion to the substrate, but of only one transistor 20. Assuming a 10 pF value, the impedance is in the order of 16 ohms at 1 GHz $(1/((2\pi)(1\ Ghz)(10\ pF))=16$ ohms)(see description below for FIG. 4). However, when the channel ground 21 is directly coupled to the substrate, as described above, $Z_{C1}$ now becomes 0.2–0.3 ohms.

The impedances $Z_{C1}$ and $Z_{C2}$ allow current $I_{DIGITAL}$ to create voltage fluctuations at the source S of transistor 20. These voltage fluctuations give rise to jitter in the data lines of the channel 12 when the gate voltage of transistor 20 is switched. This jitter increases as the source voltage fluctuations increase. To first-order, source voltage fluctuations are directly proportional to $I_{DIGITAL}$, $Z_0$ and $Z_1$ and inversely proportional to $Z_{C1}$. Hence minimization of jitter requires minimization of $Z_0$ and $Z_1$ and maximization of $Z_{C1}$.

The present invention minimizes node 25 error voltage by increasing the coupling impedance $Z_{C1}$ so that a higher impedance path exists between the nodes 25 and 26. When $Z_{C1}$ is of a sufficiently high value, the increased impedance functions to isolate the two nodes 25, 26 from each other and attenuates the interference from coupling over to the node 25. Since the prior art practice caused $Z_{C1}$ to be close to an electrical short, any increase in the impedance of $Z_{C1}$ is significant in preventing the coupling of the digital interference from the digital core 23 to the source S node 25.

Accordingly, it is the practice of the present invention to increase the coupling impedance $Z_C$ and, more specifically $Z_{C1}$, so that the switching operation of the circuitry in the digital core 23 is minimally coupled over to the source junction of the output transistor 20 through the substrate ground path. It is appreciated that a variety of techniques are available to increase the impedance of $Z_{C1}$. The preferred technique below describes one such technique.

Since impedance $Z_{C2}$ is intrinsically low and impedance $Z_L$ is also difficult to adjust, the preferred technique attempts to increase the impedance of $Z_{C1}$ to increase the overall coupling impedance $Z_C$. The preferred technique achieves this by treating the channel ground coupling at pad 18 as a signal input to the controller chip 10. Instead of coupling the channel ground directly to the substrate, a minimal capacitance coupling is introduced in the path.

Referring to FIG. 2, a diode 31 is used to couple the channel ground 21 to the substrate. The diode 31 is non-forward biased (typically zero biased), so that the impedance is determined by the capacitance (shown as capacitor $C_1$) of the n-p junction of the diode. Typically, this is calculated to be in the order of picofarads (pF). A similar non-forward biased diode (having capacitance shown by $C_2$) is placed between the channel ground 21 and a supply voltage of the controller chip 10 (shown as $V_{DD}$). Typically, there is a sizeable decoupling capacitance (shown as capacitor $C_3$) for the device between $V_{DD}$ and the substrate on the controller chip 10. By equivalence, the total capacitance between node 25 and the substrate through both paths is approximated as $C_1+C_2$ (since $C_3$ is in series with $C_2$ and $C_2<<C_3$) and $Z_{C1}=1/(2\pi f(C1+C2))$.

Referring to FIG. 3, the diode arrangement of FIG. 2 is shown with reference to the source S of transistor 20. Instead of coupling the channel ground 21 directly to the substrate ground (pursuant to the prior art practice), the diode 31 is inserted between the connection at node 25 and the substrate. Similarly, diode 30 is inserted between node 25 and the chip supply $V_{DD}$. If the capacitance of the non-biased junction of the diodes is in the order of 5 pF, then the impedance at 1 GHz is determined as $1/(2\pi(1\text{ GHz})(10\text{ pF}))$, or approximately 16 ohms. If the capacitance is in the order of 0.5 pF, the resulting impedance is approximately 160 ohms. The junction capacitance value determines the impedance at a given frequency and this impedance is $Z_{C1}$ in FIG. 1. Thus, 16 ohms is a significant improvement over the prior art value of 0.2–0.3 ohms for $Z_{C1}$. The impedance of 16 ohms is an order of magnitude better than the prior art value for $Z_{C1}$ and 160 ohms is another order of magnitude in improvement.

It is appreciated that the invention is implemented in the example above by the physical presence of the diode 31 between the channel ground 21 (node 25) and the substrate of the device. Similarly, diode 30 is placed between the channel ground 21 and $V_{DD}$, but electrically the diode capacitance is parallel to that of diode 31. The diode arrangement treats the channel ground connection at pad 18 more as a signal input (rather than as a power connection), so that the capacitances of the non-forward biased diodes function to decouple the jitter on the source of the transistor by increasing the coupling impedance between the source S and the digital core of the controller chip.

The diode arrangement is a typical electrostatic discharge network for use in protecting signal line inputs. Accordingly, other techniques used for protecting electrostatic discharges at the input of signal lines can be readily used in place of diodes 30 and 31, provided the coupling impedance $Z_C$ is increased. In FIG. 3, additional diodes 32 and 33 are utilized at the output terminal 17 to further protect the output. These diodes 32 and 33 are utilized at the output terminal 17 to protect the drain of the transistor 20. However, it is appreciated that the substantial impact of the invention is its application at the ground connection.

Although separate diodes can be fabricated to provide diodes 30 and 31 (as well as diodes 32 and 33) within the controller chip 10, an alternative and preferred technique for obtaining half of the diodes is illustrated in FIG. 4. Since the n diffusions of the source S and drain D provide n-p junctions with the p-substrate and since these junctions are already present as part of transistor 20, these junctions can be used for providing diodes 31 and 33, as shown. Thus, diodes 31 and 33 are already present as part of the transistor 20. Only diodes 30 and/or 32 need be additionally fabricated on the controller chip 10.

It is appreciated that the n-p junctions of the transistor 20 were present in the prior art practice. However, the n-p junctions of the transistor 20 could not provide the higher junction impedance $Z_{C1}$, since the prior art practice of connecting the channel ground to the substrate short-circuited this junction with the impedance of 0.2–0.3 ohms. That is, the prior art practice would have coupled the channel ground 21 connection shown in FIG. 4 to the substrate 22, for example, by a p+ tie to the p substrate.

Furthermore, it is appreciated that the invention can be optimized further if the impedance $Z_{C1}$ can be increased further. Thus, optimizing or maximizing the value of $Z_{C1}$ will decrease the interference coupling to the source of the transistor. In the example above, if $Z_{C1}$ can be increased from 16 ohms to 160 ohms, an order of magnitude improvement can be achieved. One way to do this is to reduce the capacitance of the source-channel and drain-channel junctions of the output transistor (essentially, reducing the capacitances of the diodes of FIG. 3) so that the junction capacitance is in the order of 0.5 pF each. This can be achieved simply by reducing the area of the n-p junctions for the transistor 20.

Accordingly, an invention is described in which jitter is minimized (reduced or removed) from the output signal lines (such as data lines) of a high-speed data channel, such as the Rambus channel. Instead of coupling the channel ground on the PC board directly to the ground network (including the substrate) on the controller chip with the intent of minimizing the impedance between the channel ground and the ground network (which includes the substrate), a signal protection scheme is used in which the coupling impedance is increased. The preferred technique of the invention attempts to maximize the impedance, or at least to optimize the impedance so that a sufficient impedance is present, between the channel ground and the chip ground network, which typically includes the chip substrate, to minimize voltage fluctuations at the data transferring device for transferring data on the data channel.

It is to be noted that the term substrate is used herein to describe the base substrate of a semiconductor wafer. Generally, the substrate is the base ground plane for devices formed on the wafer. However, there can be circumstances in which a layer formed above the substrate operates as the base ground plane for the chip. In those instances, the layer which operates equivalently to the substrate in providing the base ground plane should be regarded functioning as the substrate in reference to the description above.

Figure 5:
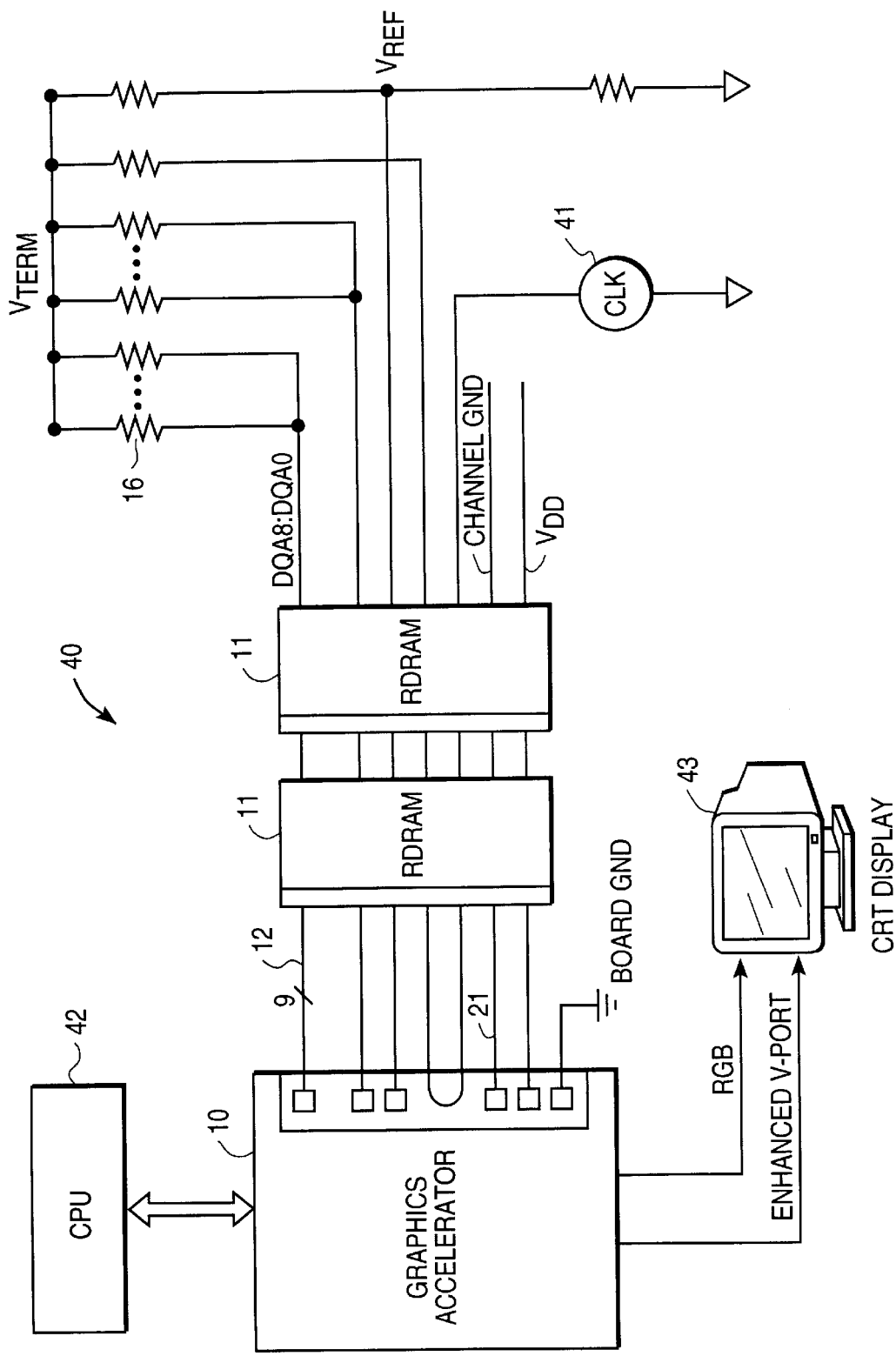
FIG. 5 is a circuit schematic diagram showing one example of a system utilizing the present invention, in which a graphics accelerator is implemented in the controller and coupled to DRAMs on a high-speed data channel, to process graphics data for display onto a display unit.

It is appreciated that the present invention can be utilized in a variety of processing or controlling devices coupled to a high-speed data channel. For example, in FIG. 5 a graphics system 40 is shown. When implemented in system 40, the controller 10 is a graphics accelerator that is coupled to a Rambus channel 12. Also on the Rambus channel are RDRAMs 11, which store video data for manipulation by the graphics accelerator. A clock 41, a reference voltage $V_{REF}$, $V_{DD}$, ground 21, as well as the termination resistors 16 to $V_{TERM}$ are shown as standard parts of the Rambus channel. The voltages $V_{DD}$, $V_{TERM}$ and the grounds are coupled onto the board from external sources, such as external power supplies. The graphics controller is coupled to a central processing unit (CPU) 42 and to a display monitor 43.

The CPU 42 processes data and sends instructions to the controller 10 for manipulating the data. The graphics data is stored in the RDRAMs 11 and at the appropriate time, the data is read and processed by the controller 10 for display on the monitor 43. The controller may employ different video protocol (such as RGB and enhanced V-Port) to display the images on the monitor 43. The present invention is implemented in the graphics' accelerator 10 in order to ensure that jitter is not introduced onto the various signal lines of the Rambus channel 12.

Thus, a grounding scheme for a high-speed data channel is described. Although the channel described references a rambus channel, the invention can be readily practiced on other data channels as well.

I claim:

1. A method to reduce jitter on a data channel utilized to transfer data between components disposed on the channel comprising:

coupling a channel ground of the channel to a data transferring device, but without coupling the channel ground directly to a ground network of a chip having the data transferring device wherein the ground network includes a substrate ground of the chip and a termination to a board ground upon which the components reside;

optimizing an impedance disposed between the channel ground and the ground network to increase impedance of a ground path through the ground network to attenuate interference coupled from the data transferring device to the data channel.

2. The method of claim 1 wherein said optimizing the impedance includes maximizing the impedance.

3. The method of claim 1 wherein said optimizing the impedance includes using a non-forward biased n-p junction between the channel ground and the substrate ground.

4. The method of claim 1 wherein said optimizing the impedance includes using a first non-forward biased n-p junction between the channel ground and the substrate ground, and a second non-forward biased n-p junction between a supply voltage for the device and the channel ground.

5. A method to reduce jitter on an output line of a data channel, in which a signal driver outputs a signal onto the output line and in which a channel ground of the data channel is also coupled to the signal driver, comprising:

coupling the channel ground to the signal driver, but without coupling the channel ground directly to a ground network of a chip including the signal driver, wherein the ground network includes a substrate ground of the chip and a termination to a board ground upon which the signal driver resides;

optimizing an impedance disposed between the channel ground and the ground network to have a sufficient value to increase impedance of a ground path through the ground network to attenuate interference coupled from the signal driver to the data channel.

6. The method of claim 5 wherein said optimizing the impedance includes maximizing the impedance.

7. The method of claim 5 wherein said optimizing the impedance includes using a non-forward biased n-p junction between the channel ground and the substrate ground.

8. The method of claim 5 wherein said optimizing the impedance includes using a first non-forward biased n-p junction between the channel ground and the substrate ground and a second non-forward biased n-p junction between a supply voltage for the device and the channel ground.

9. A method to reduce jitter on a data channel utilized to transfer data between components disposed on the channel comprising:

coupling a channel ground of the channel to a data transferring device on a chip by coupling the channel ground as a signal line for isolation line from a ground network of the chip, wherein the ground network includes a substrate ground of the chip and a termination to a board ground upon which the channel resides;

placing an electrostatic discharge network of sufficient impedance between the channel ground and the ground network to increase impedance of a ground path between the channel ground and the substrate ground to attenuate digital switching interference coupled to the data channel by the ground path.

10. The method of claim 9 wherein said placing the electrostatic discharge network includes maximizing the impedance.

11. The method of claim 9 said placing the impedance includes using a non-forward biased n-p junction between the channel ground and the substrate ground.

12. The method of claim 9 wherein said placing the impedance includes using a first non-forward biased n-p junction between the channel ground and the substrate ground and a second non-forward biased n-p junction between a supply voltage for the device and the channel ground.

13. A method to reduce jitter on a data channel resident on a printed circuit board when the circuit board is coupled to a chip utilized for transferring data on the channel comprising:

coupling a channel ground of the channel to the chip, but without coupling the channel ground directly to a ground network of the chip wherein the ground network includes a substrate ground of the chip and a termination to a board ground of the circuit board upon which board the chip and the channel reside;

optimizing an impedance disposed between the channel ground and the ground network to increase impedance of a ground path through the sound network to attenuate interference to the data channel.

14. The method of claim 13 wherein said optimizing the impedance includes maximizing the impedance.

15. The method of claim 13 wherein said optimizing the impedance includes using a non-forward biased n-p junction between the channel ground and the substrate ground.

16. The method of claim 13 wherein said optimizing the impedance includes using a first non-forward biased n-p junction between the channel ground and the substrate ground and a second non-forward biased n-p junction between a supply voltage for the chip and the channel ground.

17. An apparatus to reduce jitter on a data channel utilized to transfer data between components disposed on the channel comprising:

a digital circuit to operate on data which is to be transferred on the data channel, said digital circuit having its ground coupled to a ground network wherein the ground network includes a substrate ground upon which substrate said digital circuit is constructed and a termination to a board ground of a circuit board upon which the components will reside, including said digital circuit;

an interface circuit coupled to said digital circuit and the data channel to output the data on the data channel, said interface circuit to couple to a channel ground of the channel, but without coupling the channel ground directly to the ground network;

an impedance of a sufficient value coupled between the channel ground and the ground network to increase impedance of a ground path through the ground network to attenuate interference coupled from said digital circuit to the data channel.

18. The apparatus of claim 17 wherein said impedance is maximized to attenuate the jitter.

19. The apparatus of claim 17 wherein said impedance includes a non-forward biased diode coupled between the channel ground and the substrate ground to provide a n-p junction, in which a capacitive reactance of the junction determines the value of said impedance.

20. The apparatus of claim 17 wherein said impedance includes a first non-forward diode coupled between the channel ground and the substrate ground to provide a n-p junction and a second non-forward biased diode coupled between the supply voltage and the channel ground to provide a second n-p junction, in which a capacitive reactance of the junctions determines the value of said impedance.

21. An apparatus to control data transfer with reduced jitter comprising:
  a data channel to transfer data between components coupled to said data channel;
  a memory coupled to said data channel as one of the components on said data channel;
  a digital controller coupled to said channel, as a second of the components on said data channel, to control data transfer to said memory on said data channel, said digital controller including:
  (a) a digital circuit to operate on data which is to be transferred on said data channel, said digital circuit having its ground coupled to a ground network of the digital controller;
  (b) an interface circuit coupled to said digital circuit and said data channel to output the data on said data channel, said interface circuit to couple to a channel ground of said channel, but without coupling the channel ground directly to said ground network;
  (c) an impedance of a sufficient value coupled between the channel ground and the ground network to increase impedance of a ground path through the ground network to attenuate interference coupled from said digital circuit to the data channel.

22. The apparatus of claim 21 wherein said impedance is maximized to attenuate the jitter.

23. The apparatus of claim 21 wherein said impedance includes a non-forward biased diode coupled between the channel ground and a substrate, which substrate is part of the ground network, to provide a n-p junction, in which a capacitive reactance of the junction determines the value of said impedance.

24. The apparatus of claim 21 wherein said impedance includes a first non-forward diode coupled between the channel ground and a substrate, which substrate is part of the ground network, to provide a n-p junction and a second non-forward biased diode coupled between the supply voltage and the channel ground to provide a second n-p junction, in which a capacitive reactance of the junctions determines the value of said impedance.

25. The apparatus of claim 21 wherein said channel comprises a high-speed, parallel data channel.

26. The apparatus of claim 21 wherein said channel comprises a Rambus channel.

* * * * *